United States Patent
Park et al.

(10) Patent No.: US 7,665,206 B2
(45) Date of Patent: Feb. 23, 2010

(54) PRINTED CIRCUIT BOARD AND MANUFACTURING METHOD THEREOF

(75) Inventors: Kwang-Soo Park, Busan (KR); Dong-Sam You, Chungcheongnam-do (KR); Bong-Soo Kim, Gyeongsangnam-do (KR); Myung-Gun Chong, Changwon-si (KR); Dae-Jung Byun, Busan (KR)

(73) Assignee: Samsung Electro-Mechanics Co., Ltd., Suwon (KR)

( * ) Notice: Subject to any disclaimer, the term of this patent is extended or adjusted under 35 U.S.C. 154(b) by 54 days.

(21) Appl. No.: 12/007,127

(22) Filed: Jan. 7, 2008

(65) Prior Publication Data

US 2008/0264687 A1    Oct. 30, 2008

(30) Foreign Application Priority Data

Apr. 27, 2007    (KR) ............... 10-2007-0041536

(51) Int. Cl.
*H05K 3/00* (2006.01)
*H05K 1/00* (2006.01)
*H05K 1/03* (2006.01)

(52) U.S. Cl. ............... 29/829; 29/830; 29/831; 29/834; 29/847; 174/264; 174/255; 361/748; 361/398; 361/736; 361/792

(58) Field of Classification Search ............. 29/825, 29/830, 831, 832, 829, 847; 361/736, 792, 361/398; 174/255, 264

See application file for complete search history.

(56) References Cited

U.S. PATENT DOCUMENTS

| | | | | |
|---|---|---|---|---|
| 4,800,461 A | * | 1/1989 | Dixon et al. | 361/751 |
| 6,324,067 B1 | * | 11/2001 | Nishiyama | 361/761 |
| 2002/0032961 A1 | * | 3/2002 | Matsuda | 29/847 |
| 2006/0003495 A1 | | 1/2006 | Sunohara et al. | |

FOREIGN PATENT DOCUMENTS

| | | |
|---|---|---|
| CN | 1761378 | 4/2006 |
| KR | 10-2006-0048664 | 5/2006 |

OTHER PUBLICATIONS

Korean Patent Office Action, mailed Aug. 26, 2008 and issued in corresponding Korean Patent Application No. 10-2007-0041536.

* cited by examiner

*Primary Examiner*—Derris H Banks
*Assistant Examiner*—Dan D Le

(57) ABSTRACT

A printed circuit board and a method of manufacturing a printed circuit board are disclosed. Using a method of manufacturing a printed circuit board, which includes: forming a multilayer board by alternately stacking circuit pattern layers and insulation layers such that a predetermined thickness of a partial area has only insulation layers stacked therein; and removing insulation layers from the partial area of the multilayer board, a printed circuit board can be manufactured that is suitable for a slim module.

4 Claims, 8 Drawing Sheets

PRINTED CIRCUIT BOARD AND MANUFACTURING METHOD THEREOF

CROSS-REFERENCE TO RELATED APPLICATIONS

This application claims the benefit of Korean Patent Application No. 10-2007-0041536 filed with the Korean Intellectual Property Office on Apr. 27, 2007, the disclosure of which is incorporated herein by reference in its entirety.

BACKGROUND

1. Technical Field

The present invention relates to a method of manufacturing a printed circuit board.

2. Description of the Related Art

In step with the trends towards slimmer electronic devices, there is ongoing research aimed at decreasing the thickness of the printed circuit board. The conventional method included developments towards reducing the thickness of interlayer material to slim the printed circuit board. However, this may create a need for stiffness enhancement operations on each layer, in order to compensate for the lowered stiffness caused by reducing the thickness of the interlayer material in the board. There may also be problems of impedance changes in the electric currents, as well as problems in securing the insulation distance between layers.

SUMMARY

An aspect of the invention is to provide a printed circuit board and a method of manufacturing a printed circuit board, which ensures stiffness and which is suitable for a slim electronic device.

One aspect of the invention provides a method of manufacturing a printed circuit board, which includes: forming a multilayer board by alternately stacking circuit pattern layers and insulation layers such that a predetermined thickness of a partial area has only insulation layers stacked therein; and removing insulation layers from the partial area of the multilayer board.

The operation of removing the insulation layer of the partial area of the multilayer board may be performed by a mechanical method, where the mechanical method may be performed using a milling machine.

Also, the operation of removing the insulation layer of the partial area of the multilayer board may include removing a portion of the predetermined thickness by a mechanical method and removing a remaining portion of the predetermined thickness using laser such that a circuit pattern layer is uncovered. Here, the laser may for example be a carbon dioxide laser.

Another aspect of the invention provides a printed circuit board that includes a first multilayer board, made of at least one insulation layer and at least one circuit pattern layer, and a second multilayer board, having at least one insulation layer and at least one circuit pattern layer stacked only in a partial area of a surface of the first board.

Additional aspects and advantages of the present invention will be set forth in part in the description which follows, and in part will be obvious from the description, or may be learned by practice of the invention.

DETAILED DESCRIPTION

Figure 1:
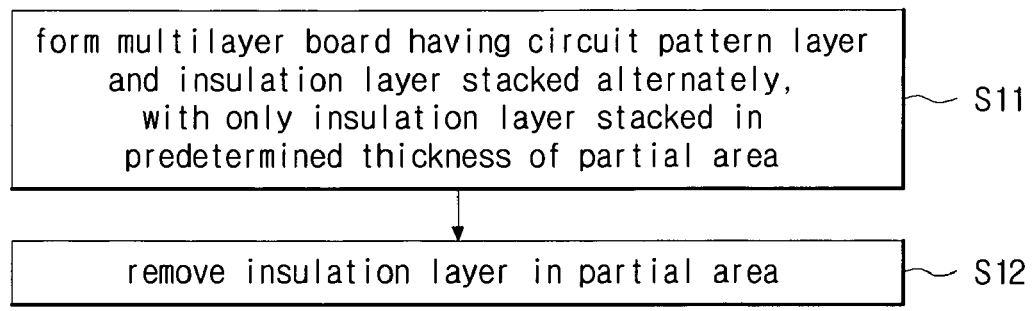
FIG. 1 is a flowchart illustrating the manufacture of a printed circuit board according to an embodiment of the present invention.

The printed circuit board and manufacturing method thereof according to certain embodiments of the invention will be described below in more detail with reference to the accompanying drawings, in which those components are rendered the same reference numeral that are the same or are in correspondence, regardless of the figure number, and redundant explanations are omitted.

FIG. 1 is a flowchart illustrating the manufacture of a printed circuit board according to an embodiment of the present invention, and FIGS. 2A to 2E represent a process diagram (depicted by cross-sectional views) illustrating the manufacture of a printed circuit board according to an embodiment of the present invention. In FIG. 2 are illustrated a multilayer board 20, insulation layers 21, circuit pattern layers 22, a partial area 23, a predetermined thickness 24, and a printed circuit board 200.

Operation S11 of FIG. 1 may include alternately stacking the circuit pattern layers and the insulation layers, with only insulation layers stacked in a predetermined thickness of a partial area. This may correspond with the procedure depicted in FIG. 2A.

Figure 2A:
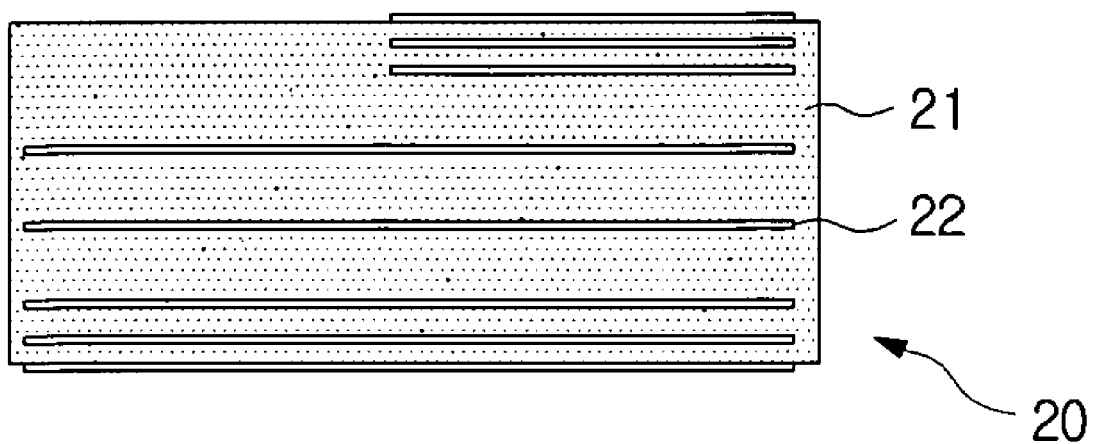
FIG. 2A, FIG. 2B, FIG. 2C, FIG. 2D, and FIG. 2E represent a process diagram illustrating the manufacture of a printed circuit board according to an embodiment of the present invention.

As a result of alternately stacking the insulation layers 21 and circuit pattern layers 22, a multilayer board 20 may be formed such as that shown in FIG. 2A. This stacking process may be performed by sequentially stacking a circuit pattern layer 22 over an insulation layer 21, or by collectively stacking several boards in which circuit pattern layers 22 are already formed on the surfaces of insulation layers 21. The insulation layers 21 may employ any of a variety of electrical materials, including prepreg, while the circuit pattern layers 22 may be formed using any of a variety of known methods, such as forming the circuit pattern layers 22 on the insulation layers 21 by applying an additive method on the insulation layers 21 or by applying a subtractive method on a copper clad laminate.

During the stacking process, the multilayer board 20 can be made to have only insulation layers 21 stacked in the partial area 23, as in FIG. 2A. This partial area 23 may be stacked only with the insulation layers 21 up to the predetermined thickness 24. Thus, there may be no circuit pattern layers 22 in the predetermined thickness 24 of the partial area 23, as shown in FIG. 2A. This partial area 23 can be a portion that will be removed in a subsequent process, and thus circuit pattern layers 22, which are made of metal, may not be formed here, to facilitate the removal process.

The partial area 23 according to this embodiment refers a corresponding area when viewed from above the multilayer board 20 (the drawing of FIG. 2 is depicted as a cross-sectional view) and may be a portion that will be removed in a subsequent process, such that the thickness of the multilayer board 20 in the partial area 23 will be made thinner by the amount removed. Thus, when the printed circuit board 200 is coupled inside an electronic device (not shown), this partial area 23 may be the area in which a component may be positioned, to determine the overall thickness of the electronic device. In this case, even if the component is thick, the amount by which the component protrudes out from the surface of the printed circuit board 200 is reduced by at least the predetermined thickness 24 of the partial area 23.

The predetermined thickness 24 according to this embodiment refers to a portion that will be removed in consideration of the thickness of the component. In the design of the printed circuit board, the predetermined thickness 24 may be stacked only with insulation layers 21, in consideration of its removal.

Figure 2B:
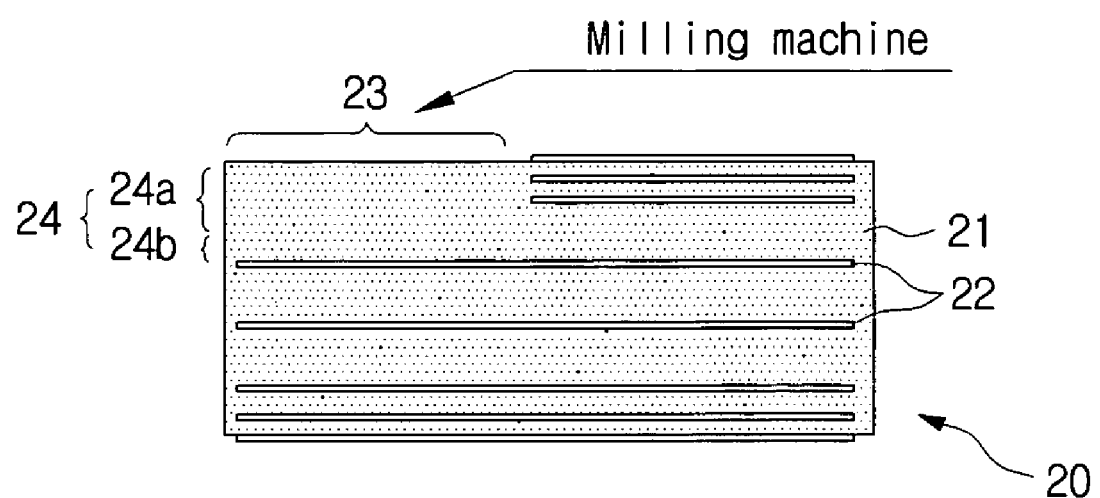
Figure 2C:
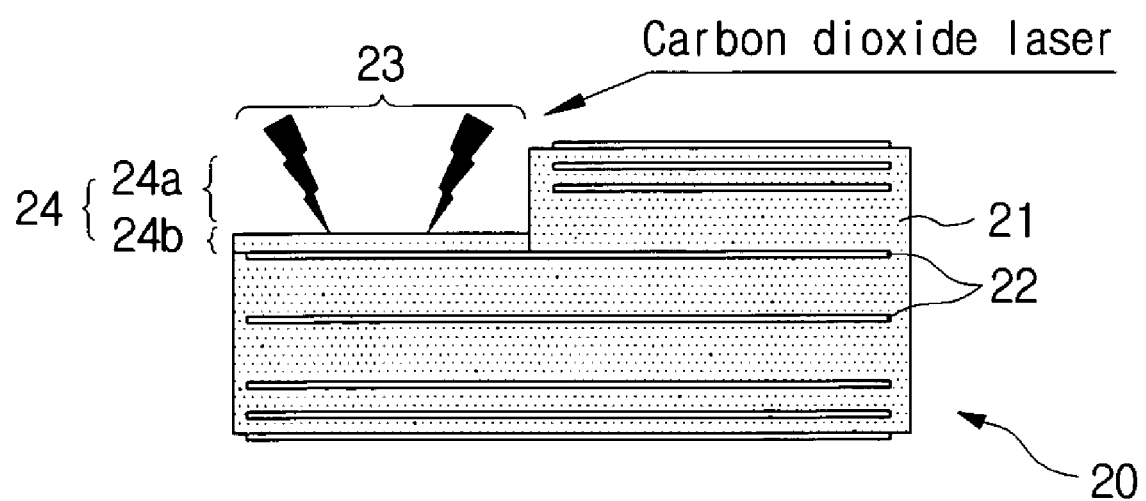

Operation S12 of FIG. 1 may include removing the insulation layers in the partial area of the multilayer board, which may correspond with the procedures depicted in FIGS. 2B and 2C.

FIG. 2B illustrates removing the insulation layers 21 up to a partial thickness 24a of the predetermined thickness 24 using a mechanical method. One reason for not removing all of the predetermined thickness 24 may be that, when removing the insulation layers 21 using a mechanical method, i.e. a milling machine, the thickness of the circuit pattern layers 22 may be too thin (about 9 to 18 μm) to operate with a milling machine until the circuit pattern layer 22 is uncovered, so that there may be a risk of the circuit pattern layer 22 being damaged. In other words, removing the insulation layers 21 without damaging the circuit pattern layer 22 may be beyond the operating tolerance of the milling machine.

Therefore, in some cases, not all of the predetermined thickness 24 may be removed by a mechanical method until the circuit pattern layer 22 is uncovered. However, if it is possible to remove all of the insulation layers 21 corresponding to the predetermined thickness 24 without damaging the circuit pattern layer 22, for example by using high-precision equipment, the process may be performed using only a mechanical method. Proceeding with this process may result in a multilayer board 20 such as that illustrated in FIG. 2C. It is seen in FIG. 2C that the insulation layers 21 may be left that correspond to the remaining thickness 24b.

If the insulation layers 21 are removed to a sufficient thickness with only the process shown in FIG. 2B, and there is no need for the component positioned in the partial area 23 to be electrically connected with the circuit pattern layer 22, the process in FIG. 2B may be sufficient. However, if it is desired that all of the insulation layers 21 corresponding to the predetermined thickness 24 of the partial area 23 be removed such that the circuit pattern layer 22 is uncovered, a process such as that in FIG. 2C may be performed.

Figure 2D:
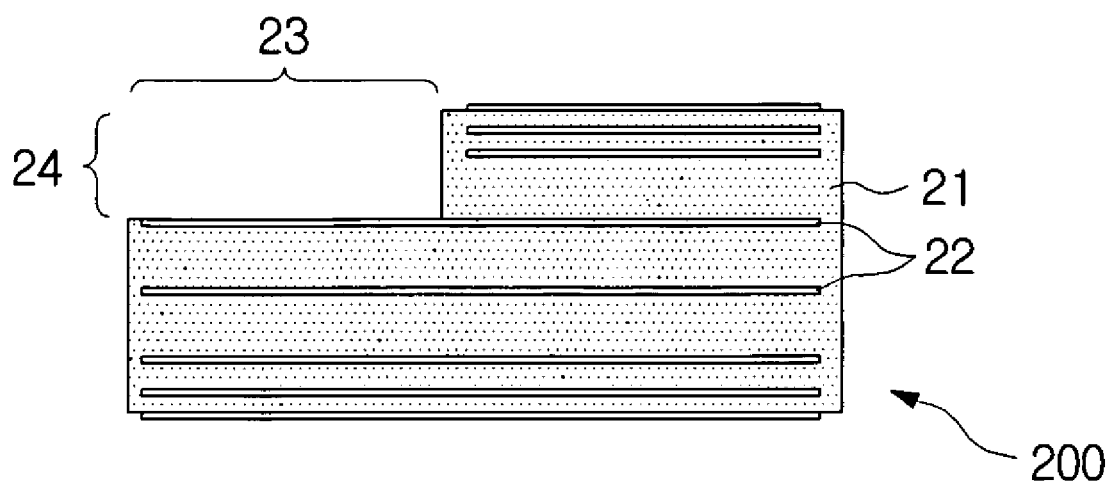

The process shown in FIG. 2C may be to remove the remaining thickness 24b using a laser. The thickness 24b remaining after mechanically removing a partial thickness 24a of the predetermined thickness 24 may be removed using precision laser. This laser may be a carbon dioxide laser. As a result of this process, a printed circuit board 200 is completed in which at least one circuit pattern layer 22 is exposed, as shown in FIG. 2D.

Figure 2E:
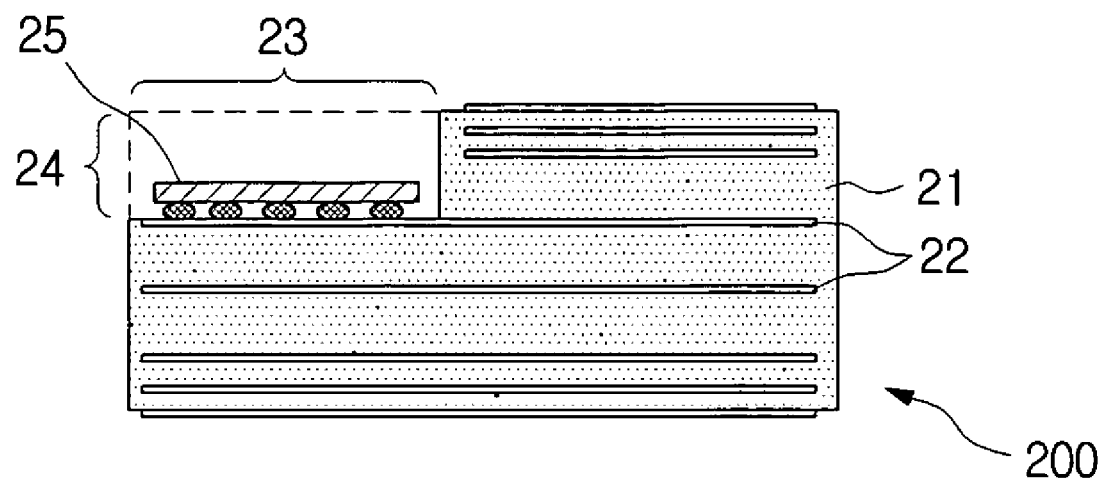

Afterwards, an operation of mounting a component may further be included, as illustrated in FIG. 2E. In the case of mounting the component 25 in a position corresponding to the partial area 23, the overall thickness of the module may not be increased greatly, despite the thickness of the component, as the predetermined thickness 24 of the partial area 23 will have been removed. FIG. 2E shows how the component 25 may have a thickness lower than the predetermined thickness 24, and thus may not emerge at the surface of the printed circuit board 200.

Figure 3A:
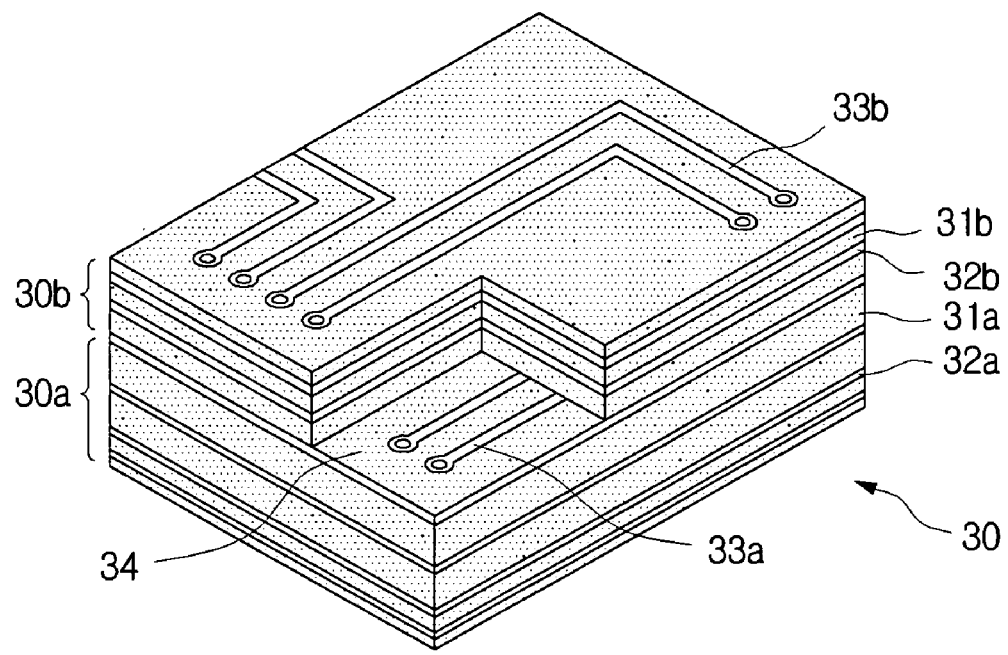
FIG. 3A is a perspective view of a printed circuit board according to another embodiment of the present invention.
Figure 3B:
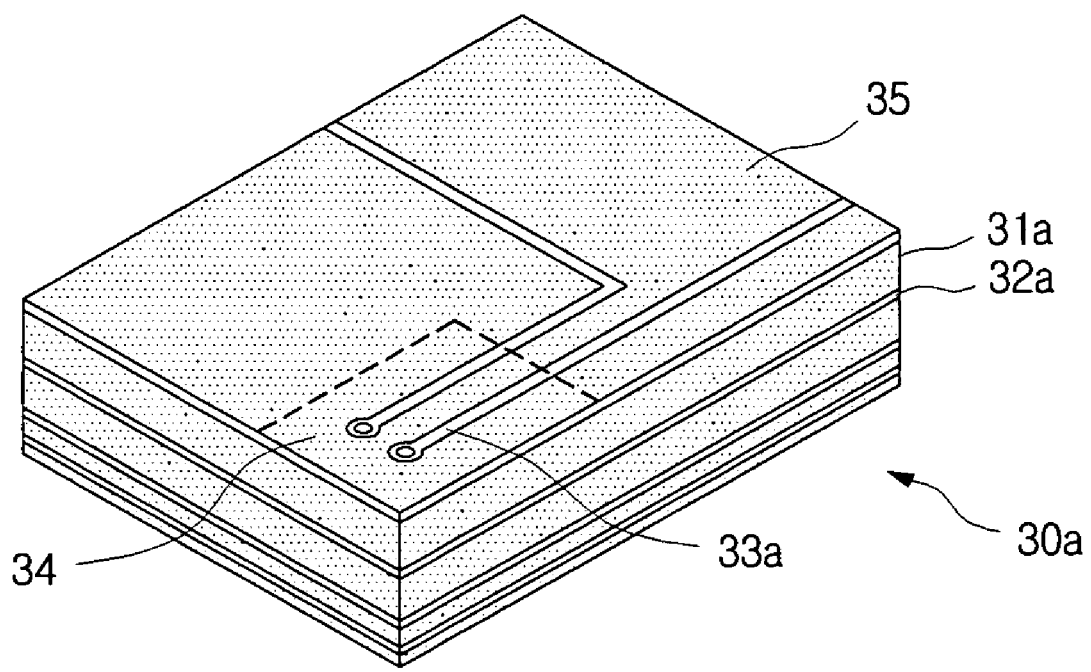
FIG. 3B is a perspective view of a first multilayer board according to another embodiment of the present invention.

FIG. 3A is a perspective view of a printed circuit board according to another embodiment of the present invention, and FIG. 3B is a perspective view of a first multilayer board according to another embodiment of the present invention. In FIGS. 3A and 3B are illustrated a printed circuit board 30, a first multilayer board 30a, a second multilayer board 30b, insulation layers 31a, 31b, circuit pattern layers 32a, 32b, circuit patterns 33a, 33b, a remaining area 34, and a partial area 35.

The first multilayer board 30a may be structured to have insulation layers 31a and circuit pattern layers 32a stacked alternately. The first multilayer board 30a may be formed by collective stacking, or may have the insulation layers 31a and circuit pattern layers 32a stacked sequentially.

The second multilayer board 30b may be a structure that is stacked only in the partial area 35 of the first multilayer board 30a, with the insulation layers 31b and circuit pattern layers 32b stacked in alternation. As the second multilayer board 30b may be stacked only in the partial area 35 of the first multilayer board 30a, there may be no portions of the second multilayer board 30b in the remaining area 34. Consequently, the thickness of the printed circuit board 30 may be thinner at the portions corresponding to the remaining area 34 of the first multilayer board 30a.

A component may be mounted in this remaining area 34 of the first multilayer board 30a. Furthermore, the circuit patterns 33a of the first multilayer board 30a and the component may be connected electrically. The remaining area 34 of the first multilayer board 30a may be formed in consideration of where the component is to be mounted. When the component (not shown) is thus mounted in the remaining area 34 of the first multilayer board 30a, the overall thickness of the module may be reduced even though the thickness of the component may be great.

As set forth above, certain embodiments of the invention can provide a printed circuit board, which ensures stiffness and which is suitable for a slim electronic device.

While the spirit of the invention has been described in detail with reference to particular embodiments, the embodiments are for illustrative purposes only and do not limit the invention. It is to be appreciated that those skilled in the art can change or modify the embodiments without departing from the scope and spirit of the invention.

What is claimed is:

1. A method of manufacturing a printed circuit board, the method comprising:
   forming a multilayer board by alternately stacking at least one circuit pattern layer and at least one insulation layer such that a predetermined thickness of a partial area has only insulation layers stacked therein; and
   removing the at least one insulation layer of the partial area of the multilayer board by removing a portion of the predetermined thickness by a mechanical method and removing a remaining portion of the predetermined thickness using a laser such that a circuit pattern layer is uncovered.

2. The method of claim 1, wherein the mechanical method is performed using a milling machine.

3. The method of claim 1, the method further comprising:
   mounting a component in a position corresponding to the area, such that the component is connected to the uncovered portion.

4. The method of claim 1, wherein the laser is a carbon dioxide laser.

* * * * *